(12) United States Patent
Fujii (10) Patent No.: US 7,741,755 B2
(45) Date of Patent: Jun. 22, 2010

(54) RECESS-PROTRUSION STRUCTURE BODY, PROCESS FOR PRODUCING THE SAME, PIEZOELECTRIC DEVICE, AND INK JET TYPE RECORDING HEAD

(75) Inventor: Takamichi Fujii, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 694 days.

(21) Appl. No.: 11/586,706

(22) Filed: Oct. 26, 2006

(65) Prior Publication Data

US 2007/0096591 A1    May 3, 2007

(30) Foreign Application Priority Data

Oct. 28, 2005   (JP) ............................. 2005-314229
Sep. 12, 2006   (JP) ............................. 2006-246543

(51) Int. Cl.
*H01L 41/08* (2006.01)

(52) U.S. Cl. ...................................... 310/328; 29/25.35

(58) Field of Classification Search ................. 310/328; 29/25.35
See application file for complete search history.

(56) References Cited

U.S. PATENT DOCUMENTS

| | | | | |
|---|---|---|---|---|
| 4,056,742 A | * | 11/1977 | Tibbetts | 310/357 |
| 5,758,396 A | * | 6/1998 | Jeon et al. | 29/25.35 |
| 5,983,471 A | * | 11/1999 | Osawa | 29/25.35 |
| 6,156,672 A | | 12/2000 | Koshido et al. | |
| 6,236,144 B1 | * | 5/2001 | Millar et al. | 310/334 |
| 6,919,668 B2 | * | 7/2005 | Nagahara et al. | 310/358 |
| 7,192,799 B2 | * | 3/2007 | Takeuchi et al. | 438/51 |
| 7,348,713 B2 | * | 3/2008 | Hashimoto | 310/334 |
| 7,537,321 B2 | * | 5/2009 | Mita | 347/72 |
| 2003/0051322 A1 | * | 3/2003 | Gutierrez et al. | 29/25.35 |
| 2003/0112298 A1 | * | 6/2003 | Sato et al. | 347/68 |
| 2004/0248047 A1 | | 12/2004 | Kato | |
| 2005/0156362 A1 | * | 7/2005 | Arnold et al. | 264/618 |

FOREIGN PATENT DOCUMENTS

| | | |
|---|---|---|
| JP | 53-70764 | 6/1978 |
| JP | 2005-153353 A | 6/2005 |
| WO | WO-01/82344 A2 | 11/2001 |

* cited by examiner

*Primary Examiner*—J. SanMartin
(74) *Attorney, Agent, or Firm*—Birch, Stewart, Kolasch & Birch, LLP

(57) ABSTRACT

In a step (A), a selectively removable resist layer or a selectively removable sacrifice layer is formed in a predetermined pattern in a protrusion non-forming region on a base plate. In a step (B), a pillar-shaped structure film is formed on a side of the base plate, on which side the resist layer or the sacrifice layer has been formed in the predetermined pattern. The pillar-shaped structure film contains a plurality of pillar-shaped bodies, each of which extends in a direction nonparallel with a base plate surface of the base plate. In a step (C), the resist layer or the sacrifice layer, and a region of the pillar-shaped structure film, which region is located on the resist layer or the sacrifice layer, are removed by use of a lift-off technique. At least one protruding region, which contains the pillar-shaped bodies, is thus formed.

21 Claims, 4 Drawing Sheets

RECESS-PROTRUSION STRUCTURE BODY, PROCESS FOR PRODUCING THE SAME, PIEZOELECTRIC DEVICE, AND INK JET TYPE RECORDING HEAD

BACKGROUND OF THE INVENTION

1. Field of the Invention

This invention relates to recess-protrusion structure body comprising a base plate and at least one protruding region, which has been formed on the base plate. This invention also relates to a process for producing the recess-protrusion structure body. This invention further relates to a piezoelectric device comprising a piezoelectric film, which contains at least one protruding region, and electrodes for applying an electric field across the piezoelectric film, the piezoelectric film and the electrodes being formed on a base plate. This invention still further relates to an ink jet type recording head, which is provided with the piezoelectric device, and an ink jet type recording apparatus, which is provided with the ink jet type recording head.

2. Description of the Related Art

Piezoelectric devices provided with a piezoelectric film, which has piezoelectric characteristics such that the piezoelectric film expands and contracts in accordance with an increase and a decrease in electric field applied across the piezoelectric film, and electrodes for applying the electric field in a predetermined direction across the piezoelectric film have heretofore been used as actuators to be loaded on ink jet type recording heads, and the like. As piezoelectric materials, there have heretofore been known composite oxides having a perovskite structure, such as lead zirconate titanate (PZT).

As described in, for example, Japanese Unexamined Patent Publication No. 2005-153353, it has been reported that the piezoelectric film is not constituted of a continuous film and is constituted of a pattern composed of a plurality of protruding regions, which are separated from one another, such that the expansion and contraction of each of the protruding regions may occur smoothly and such that a large displacement quantity may be obtained. In order for a desired strain displacement quantity to be obtained, the piezoelectric film is formed so as to have a thickness falling within the range of approximately 1 µm to approximately 5 µm. The thickness of the piezoelectric film falling within the aforesaid range is larger than the thickness of each of the electrodes, and the like, on the order of nanometers (e.g., the thickness of 200 nm). As described in, for example, International Patent Publication No. WO01/082344, heretofore, the piezoelectric films, such as the PZT films, are ordinarily subjected to the patterning with dry etching processing.

Figure 6:
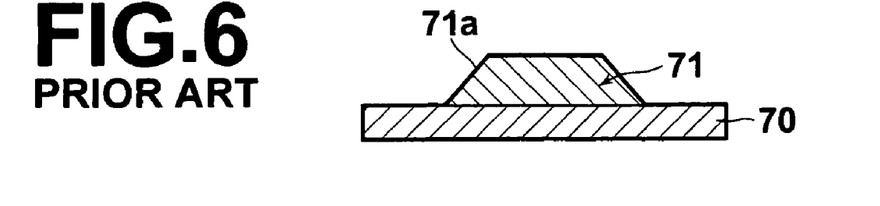
FIG. 6 is an explanatory sectional view showing problems encountered with a conventional technique.

Ordinarily, the dry etching processing is known as anisotropic etching processing. However, PZT, or the like, is a material which is hard to etch. Also, the piezoelectric films are thicker than the electrodes, and the like, having a thickness on the order of nanometers. Therefore, the drying etching processing of the piezoelectric films is harder to perform than the processing of the electrodes, and the like. Accordingly, in cases where the dry etching processing is performed on the piezoelectric films, perfectly anisotropic etching is not always capable of being achieved. FIG. 6 is an explanatory sectional view showing problems encountered with the conventional technique. Specifically, as illustrated in FIG. 6, side faces 71a, 71a, . . . of a protruding region 71 having been formed with the dry etching processing are apt to have taper shapes. In FIG. 6, reference numeral 70 represents a base plate.

In the cases of the ink jet type recording heads, such that enhanced image quality of recorded images may be obtained, a high level of uniformity in piezoelectric characteristics of the plurality of the protruding regions constituting the piezoelectric films is required of the ink jet type recording heads. However, with the dry etching processing, which yields the protruding regions having the taper side face shapes, it is not always possible to accomplish accurate matching of angles of the side faces of the plurality of the protruding regions. Hereafter, there will be the possibility that the adverse effects of a variation in piezoelectric characteristics, which variation occurs due to a variation in shapes of the protruding regions, upon the image quality of the recorded images will not be capable of being ignored. In cases where the accuracy of the side face shapes of the protruding regions is taken into consideration, there should preferably be employed a patterning technique, such that the side face shapes of the protruding regions are capable of being reliably set at shapes approximately normal to a surface of a base plate, on which the protruding regions are formed.

Also, with the piezoelectric films, such as the PZT films, the problems are encountered in that, since the dry etching processing is hard to perform due to the material characteristics and the thicknesses of the piezoelectric films, a long time is required to perform the patterning. Further, with the dry etching processing, since a vacuum process is necessary, the cost is not capable of being kept low.

As a patterning technique for electrodes, dielectric substances, and the like, a lift-off technique has heretofore been known. (The lift-off technique is described in, for example, Japanese Unexamined Patent Publication No. 53(1978)-070764, U.S. Pat. No. 6,156,672, and U.S. Patent Application Publication No. 20040248047.) The lift-off technique will be described hereinbelow with the patterning of electrodes being taken as an example.

Figure 7A:
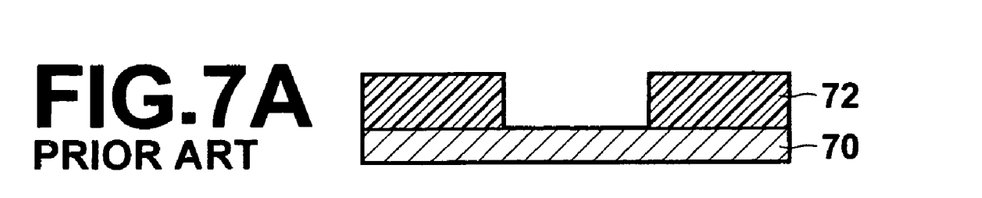
FIGS. 7A, 7B, and 7C are explanatory sectional views showing problems encountered with a conventional technique.
Figure 7B:
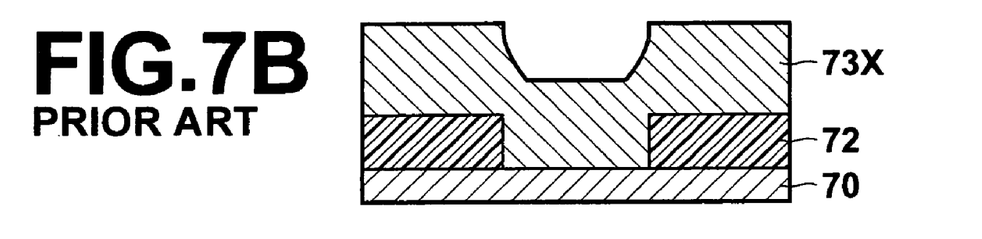
Figure 7C:
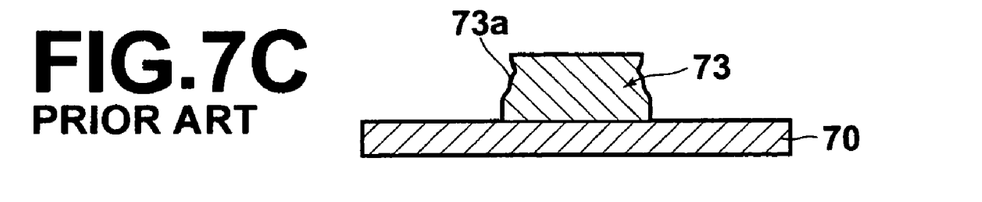
Figure 7D:
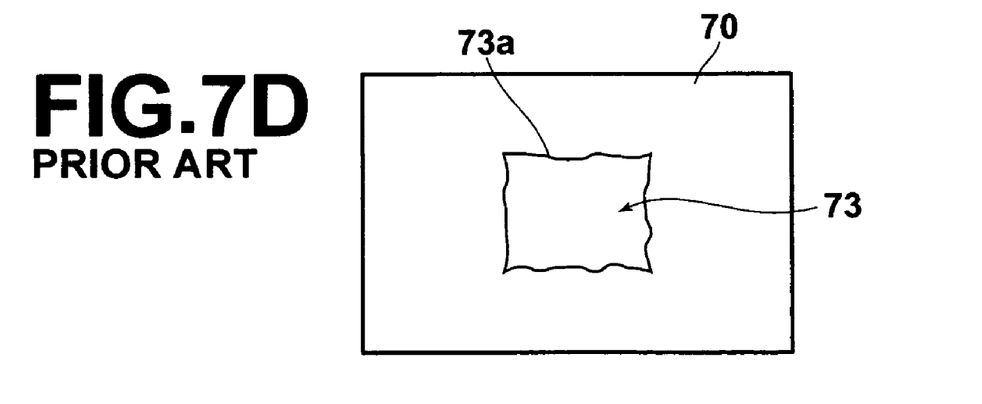
FIG. 7D is a plan view of FIG. 7C.

FIGS. 7A, 7B, and 7C are explanatory sectional views showing problems encountered with a conventional technique. FIG. 7D is a plan view of FIG. 7C. With the lift-off technique, as illustrated in FIG. 7A, a resist layer (or a sacrifice layer) 72, which is capable of being removed selectively, is formed in a predetermined pattern in electrode non-forming regions on a base plate 70. Thereafter, as illustrated in FIG. 7B, a solid electrode film 73X is formed on the base plate 70. Thereafter, as illustrated in FIG. 7C, processing for removing the resist layer 72 is performed. With the processing, the areas of the solid electrode film 73X, which areas are located on the resist layer 72, are removed together with the resist layer 72. In this manner, an electrode 73 is capable of being formed in a predetermined pattern.

In the cases of the patterning of a thin film for the formation of an electrode, or the like, which has a thickness on the order of nanometers, the patterning is capable of being performed accurately with the lift-off technique, and the side face of the protruding region, which is formed with the patterning, is capable of being set at a shape approximately normal to the base plate surface.

However, in cases where the lift-off technique is applied directly to the patterning of a piezoelectric film, which has a large thickness on the order of microns, since the thickness of the piezoelectric film located on the resist layer (or the sacrifice layer) is large, it is not always possible to remove the resist layer (or the sacrifice layer) and the unnecessary regions of the piezoelectric film, which regions are located on the resist layer (or the sacrifice layer). Also, in such cases, it is necessary that the unnecessary regions of the piezoelectric film and a necessary region of the piezoelectric film are separated from each other, and that the unnecessary regions of the piezoelectric film are thus removed. Therefore, as illustrated in FIGS. 7C and 7D, the smoothness of shapes of side faces 73a, 73a, . . . of the protruding region is apt to become bad, and pattern loss often occurs. Thus it is not always possible to obtain a pattern with a good shape accuracy.

Recently, with respect to organic materials, a technique for patterning protruding regions, which has a shape approximately normal to a base plate surface, with a high definition by use of a nano-imprinting technique has been used in practice. However, the nano-imprinting technique is not capable of being applied to inorganic materials.

SUMMARY OF THE INVENTION

The primary object of the present invention is to provide a protruding region patterning technique, with which a shape accuracy of a protruding region is capable of being kept high, regardless of a material and a thickness of the protruding region, with which a shape of a side face of the protruding region is capable of being reliably set at a shape approximately normal to a base plate surface, and which is appropriate for patterning of a piezoelectric film, or the like.

Another object of the present invention is to provide a recess-protrusion structure body, which is obtained with the protruding region patterning technique.

A further object of the present invention is to provide a piezoelectric device, which is obtained with the protruding region patterning technique.

A still further object of the present invention is to provide an ink jet type recording head, which is obtained with the protruding region patterning technique.

The present invention particularly aims at accomplishing the patterning of the protruding region constituted of an inorganic material. The present invention is also applicable to an organic material.

The present invention provides a process for producing a recess-protrusion structure body, which comprises a base plate and at least one protruding region having been formed on the base plate, the process comprising:

i) a step (A) of forming a selectively removable resist layer or a selectively removable sacrifice layer in a predetermined pattern in a protrusion non-forming region on the base plate,     ii) a step (B) of forming a pillar-shaped structure film on a side of the base plate, on which side the resist layer or the sacrifice layer has been formed in the predetermined pattern, the pillar-shaped structure film containing a plurality of pillar-shaped bodies, each of which extends in a direction nonparallel with a base plate surface of the base plate, and     iii) a step (C) of removing the resist layer or the sacrifice layer, and a region of the pillar-shaped structure film, which region is located on the resist layer or the sacrifice layer, by use of a lift-off technique, whereby the at least one protruding region, which contains the plurality of the pillar-shaped bodies, is formed.

The term "protrusion non-forming region" as used herein means the region, in which the protruding region is not formed, such as a region between the protruding regions adjacent to each other.

The pillar-shaped structure film containing the plurality of the pillar-shaped bodies may have a crystalline structure. Alternatively, the pillar-shaped structure film may have an amorphous structure. However, the pillar-shaped structure film should preferably have the crystalline structure.

The process for producing a recess-protrusion structure body in accordance with the present invention should preferably be modified such that the resist layer or the sacrifice layer is formed in the predetermined pattern in the step (A) by use of a technique selected from the group consisting of a lift-off technique, a photolithography technique, and a transfer molding technique. Also, the process for producing a recess-protrusion structure body in accordance with the present invention should preferably be modified such that the sacrifice layer, which contains a carbon-containing compound and/or a carbon simple substance as a principal constituent, is formed in the predetermined pattern.

The term "containing a carbon-containing compound and/or a carbon simple substance as a principal constituent" as used herein means that the proportion of the carbon-containing compound and/or the carbon simple substance is equal to at least 90% by mass.

Further, the process for producing a recess-protrusion structure body in accordance with the present invention should preferably be modified such that the formation of the pillar-shaped structure film in the step (B) is performed under heating conditions.

The present invention also provides a recess-protrusion structure body, produced with the process for producing a recess-protrusion structure body in accordance with the present invention.

The present invention further provides a recess-protrusion structure body, comprising:

i) a base plate, and ii) at least one protruding region, which has been formed on the base plate, the at least one protruding region having been formed with patterning processing performed on a pillar-shaped structure film containing a plurality of pillar-shaped bodies, each of which extends in a direction nonparallel with a base plate surface of the base plate, each of the plurality of the pillar-shaped bodies, which are exposed at a side face of the protruding region, being terminated at an interface of the pillar-shaped body.

The recess-protrusion structure body in accordance with the present invention should preferably be modified such that a height of the protruding region is equal to at least 1 µm, and a mean pillar diameter of the plurality of the pillar-shaped bodies contained in the protruding region falls within the range of 30 nm to 1 µm.

Also, the recess-protrusion structure body in accordance with the present invention may be modified such that an angle of a side face of the protruding region with respect to the base plate surface of the base plate falls within the range of 90±45°.

Figure 5A:
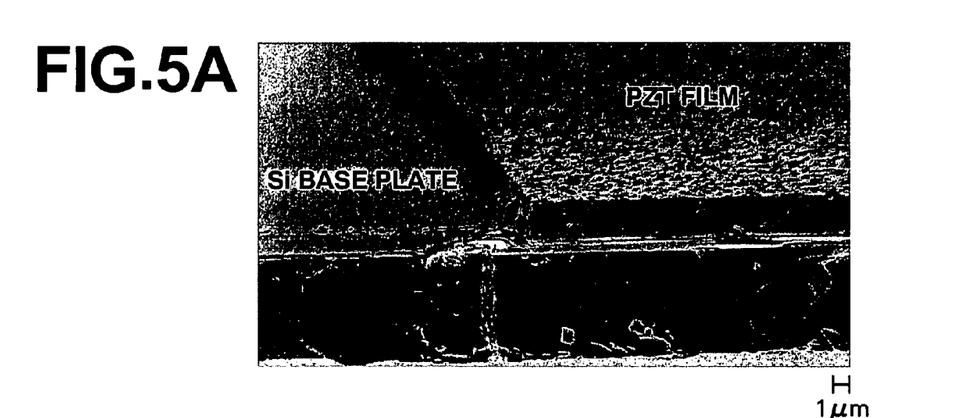
FIG. 5A is a diagram showing an SEM perspective photograph of a recess-protrusion structure body obtained in Example 2.
Figure 5B:
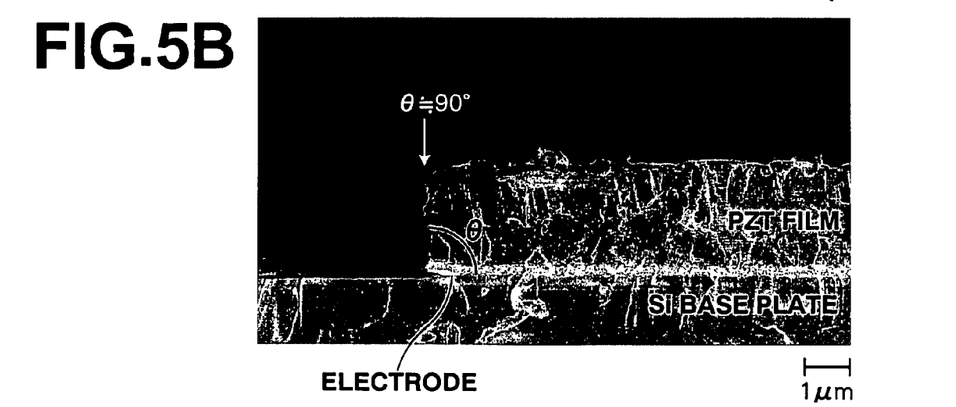
FIG. 5B is a diagram showing an SEM sectional photograph of the recess-protrusion structure body obtained in Example 2.

The term "angle of a side face of a protruding region with respect to a base plate surface" as used herein means the angle represented by reference letter "θ" in FIG. 5B.

Further, the recess-protrusion structure body in accordance with the present invention may be modified such that the protruding region is constituted of an inorganic material.

The recess-protrusion structure body is efficient in cases where the protruding region is constituted of a dielectric substance. The recess-protrusion structure body is particularly efficient in cases where the protruding region is constituted of a piezoelectric material.

The present invention still further provides a piezoelectric device, which is provided with the recess-protrusion structure body in accordance with the present invention, and in which the protruding region is constituted of a piezoelectric material, the piezoelectric device comprising:

i) the base plate, ii) a piezoelectric film, which contains the at least one protruding region, and which has been formed on the base plate, and iii) electrodes, which have been formed on the base plate, the electrodes applying an electric field across the piezoelectric film.

The present invention also provides an ink jet type recording head, comprising the piezoelectric device in accordance with the present invention.

The present invention also provides an ink jet type recording apparatus, comprising the ink jet type recording head in accordance with the present invention.

The process for producing a recess-protrusion structure body in accordance with the present invention comprises: (i) the step (A) of forming the selectively removable resist layer or the selectively removable sacrifice layer in the predetermined pattern in the protrusion non-forming region on the base plate, (ii) the step (B) of forming the pillar-shaped structure film on the side of the base plate, on which side the resist layer or the sacrifice layer has been formed in the predetermined pattern, the pillar-shaped structure film containing the plurality of the pillar-shaped bodies, each of which extends in the direction nonparallel with the base plate surface of the base plate, and (iii) the step (C) of removing the resist layer or the sacrifice layer, and the region of the pillar-shaped structure film, which region is located on the resist layer or the sacrifice layer, by use of the lift-off technique, whereby the at least one protruding region, which contains the plurality of the pillar-shaped bodies, is formed.

The pillar-shaped bodies, which are adjacent to each other, are apt to be mechanically separated easily from each other. Therefore, with the process for producing a recess-protrusion structure body in accordance with the present invention, in the lift-off step (C), the unnecessary region and the necessary region of the pillar-shaped structure film are capable of being separated appropriately from each other at the interface of each of the pillar-shaped bodies, and only the unnecessary region of the pillar-shaped structure film is capable of being removed easily and at a high accuracy. Accordingly, pattern defects, such as pattern loss, are capable of being suppressed markedly.

Also, with the process for producing a recess-protrusion structure body in accordance with the present invention, wherein the unnecessary region and the necessary region of the pillar-shaped structure film are capable of being separated from each other at the interface of each of the pillar-shaped bodies, the face direction of the side face of the protruding region is capable of coinciding with the direction of growth of the pillar-shaped bodies. Therefore, a variation of the angle of the side face of the protruding region, which variation occurs among the protruding regions, is capable of being suppressed markedly. Also, the smoothness of the side face of the protruding region is capable of being kept good. In cases where the pillar-shaped bodies are caused to grow in the direction approximately normal to the base plate surface, the shape of the side face of the protruding region is capable of being reliably set at a shape approximately normal to the base plate surface.

As described above, with the process for producing a recess-protrusion structure body in accordance with the present invention, regardless of the material and the thickness of the protruding region, the shape accuracy of the protruding region of the recess-protrusion structure body is capable of being kept high.

With the process for producing a recess-protrusion structure body in accordance with the present invention, in cases where the protruding region has a large height on the order of microns, the patterning processing is capable of being performed more quickly than with the dry etching. Also, with the process for producing a recess-protrusion structure body in accordance with the present invention, wherein a high vacuum process, such as the dry etching, need not be performed at the time of the patterning processing, the cost is capable of being kept low.

DESCRIPTION OF THE PREFERRED EMBODIMENTS

The present invention will hereinbelow be described in further detail with reference to the accompanying drawings.

[Piezoelectric Device and Ink Jet Type Recording Head]

Figure 1:
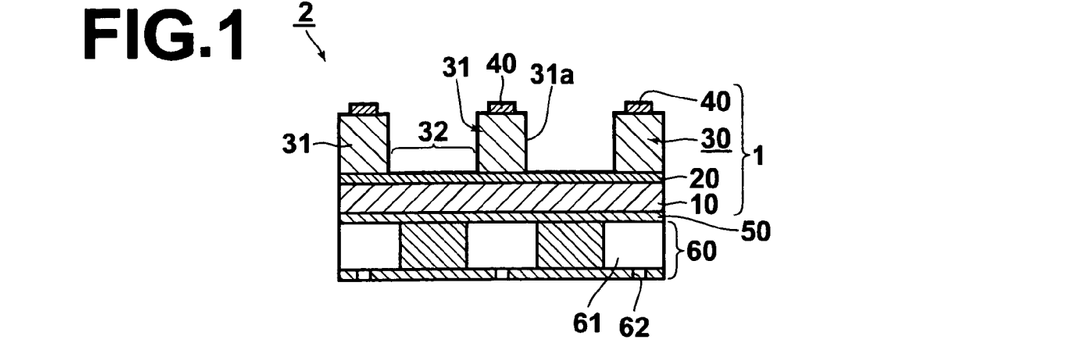
FIG. 1 is a sectional view showing an embodiment of the piezoelectric device in accordance with the present invention and an ink jet type recording head comprising the piezoelectric device.

An embodiment of the piezoelectric device (acting as the recess-protrusion structure body) in accordance with the present invention and an ink jet type recording head comprising the piezoelectric device will be described hereinbelow with reference to FIG. 1. FIG. 1 is a sectional view showing a major part of the ink jet type recording head, the view being taken in the thickness direction of the piezoelectric device. In FIG. 1, for clearness, reduced scales of constituent elements of the ink jet type recording head are varied from actual reduced scales.

With reference to FIG. 1, a piezoelectric device (acting as the recess-protrusion structure body) 1, which is an embodiment of the piezoelectric device in accordance with the present invention, comprises a base plate 10. The piezoelectric device 1 also comprises a bottom electrode 20, a piezoelectric film (acting as the pillar-shaped structure film) 30, and a plurality of top electrodes 40, 40, . . . , which are laminated in this order on the base plate 10. The piezoelectric film 30 is constituted of an inorganic compound having the piezoelectric characteristics. An electric field is applied across the piezoelectric film 30 in the thickness direction of the piezoelectric film 30 by the bottom electrode 20 and each of the top electrodes 40, 40, . . . .

The bottom electrode 20 is formed over the approximately entire area of the surface of the base plate 10. The piezoelectric film 30 is formed on the bottom electrode 20. The piezoelectric film 30 has a pattern, in which a plurality of line-like protruding regions 31, 31, . . . have been formed in a striped pattern. Each of the top electrodes 40, 40, . . . is formed on one of the protruding regions 31, 31, . . . of the piezoelectric film 30. Each of regions 32, 32, . . . , in which the protruding regions 31, 31, . . . of the piezoelectric film 30 are not been formed, is the protrusion non-forming region. The pattern of the piezoelectric film 30 is not limited to the pattern illustrated in FIG. 1 and may be designed arbitrarily.

No limitation is imposed upon a material of the base plate 10. Examples of the materials of the base plate 10 include silicon, glass, stainless steel, yttrium stabilized zirconia (YSZ), alumina, sapphire, and silicon carbide.

No limitation is imposed upon a material of the bottom electrode 20. Examples of the materials of the bottom electrode 20 include metals, such as Pt and Ir; metal oxides, such as $IrO_2$, $RuO_2$, $LaNiO_3$, and $SrRuO_3$; and combinations of the above-enumerated metals and/or the above-enumerated metal oxides.

Also, no limitation is imposed upon a material of the top electrodes 40, 40, . . . . Examples of the materials of the top electrodes 40, 40, . . . include the materials exemplified above for the bottom electrode 20; electrode materials ordinarily utilized in semiconductor processes, such as Al, Ta, Cr, and Cu; and combinations of the materials exemplified above for the bottom electrode 20 and/or the above-enumerated electrode materials.

No limitation is imposed upon a material of the piezoelectric film 30. However, the material of the piezoelectric film 30 should preferably be selected from composite oxides having a perovskite structure, which composite oxides may contain inevitable impurities. Examples of the composite oxides having the perovskite structure include lead-containing compounds, such as lead zirconate titanate (PZT), lead zirconate, lead lanthanum titanate, lead lanthanum zirconate titanate, magnesium niobate lead zirconate titanate, and nickel niobate lead zirconate titanate; lead-free compounds, such as barium titanate, sodium niobate, and bismuth titanate; and combinations of the above-enumerated compounds. The above-enumerated piezoelectric materials are ferroelectric substances having spontaneous polarization characteristics at the time free from electric field application.

No limitation is imposed upon the film thickness of the piezoelectric film 30 (i.e., the height of each of the protruding regions 31, 31, . . . ). The thickness of the piezoelectric film 30 may ordinarily be at least 1 μm and may fall within the range of, for example, 1 μm to 5 μm. The thickness of the piezoelectric film 30 is larger than the thickness of each of the bottom electrode 20 and the top electrodes 40, 40, . . . on the order of nanometers (e.g., 200 nm).

The piezoelectric film 30 is constituted of a crystalline inorganic film containing a plurality of pillar-shaped bodies, each of which extends in a direction nonparallel with the base plate surface of the base plate 10. Each of the plurality of the pillar-shaped bodies, which are exposed at a side face 31a of each of the protruding regions 31, 31, . . . , is terminated at the interface of each of the pillar-shaped bodies. (Reference may be made to the SEM sectional photograph of the piezoelectric device (the recess-protrusion structure body) obtained in Example 2, which photograph is illustrated in FIG. 5B.)

The piezoelectric film 30 should preferably have a crystalline structure. In such cases, the piezoelectric film 30 containing the pillar-shaped bodies is capable of being formed easily. Alternatively, the piezoelectric film 30 may have an amorphous structure, such that the piezoelectric film 30 containing the plurality of the pillar-shaped bodies is capable of being formed.

No limitation is imposed upon the mean pillar diameter of the plurality of the pillar-shaped bodies contained in the piezoelectric film 30. However, the mean pillar diameter of the plurality of the pillar-shaped bodies should preferably fall within the range of 30 nm to 1 μm. If the mean pillar diameter of the plurality of the pillar-shaped bodies is markedly small, there will be the risk that the crystal growth sufficient for the piezoelectric body will not occur, and that the desired piezoelectric performance will not be capable of being obtained. If the mean pillar diameter of the plurality of the pillar-shaped bodies is markedly large, there will be the risk that the shape accuracy of the protruding regions 31, 31, . . . of the piezoelectric film 30 obtained from the patterning processing will become bad.

As for pillar-shaped structure films containing a plurality of pillar-shaped bodies, research has heretofore been conducted on a relationship between film forming conditions (a base plate temperature and a film forming pressure) and shapes or pillar diameters of pillar-shaped bodies, and on classification of pillar-shaped bodies.

The aforesaid research with respect to vacuum deposited films is described in detail in, for example, a report of Movchan and Demchishin, Phys. Met. Mettallogr., 28, 83 (1969). In cases where the piezoelectric film 30 is a vacuum deposited film, the pillar-shaped bodies contained in the piezoelectric film 30 should preferably be of Zone 2 in accordance with the classification described in the aforesaid report.

Also, the aforesaid research with respect to sputtering films is described in detail in, for example, a report of Thornton, J. Vac. Sci. Technol., 11, 666 (1974). In cases where the piezoelectric film 30 is a sputtering film, the pillar-shaped bodies contained in the piezoelectric film 30 should preferably be of Zone T to Zone II in accordance with the classification described in the aforesaid report.

No limitation is imposed upon the angle θ of the side face 31a of each of the protruding regions 31, 31, . . . of the piezoelectric film 30 with respect to the base plate surface of the base plate 10. In cases where the shape accuracy of the side face 31a of each of the protruding regions 31, 31, . . . of the piezoelectric film 30 is taken into consideration, the angle θ of the side face 31a of each of the protruding regions 31, 31, . . . of the piezoelectric film 30 with respect to the base plate surface of the base plate 10 should preferably fall within the range of 90±45°, should more preferably fall within the range of 90±30°, and should particularly preferably fall within the range of 90±10°. As will be described later in detail, with this embodiment, the angle θ of the side face 31a of each of the protruding regions 31, 31, . . . of the piezoelectric film 30 with respect to the base plate surface of the base plate 10 is capable of being reliably set so as to fall within the range described above.

An ink jet type recording head 2 approximately has a constitution, in which a vibrating plate 50 is secured to the bottom surface of the base plate 10 of the piezoelectric device 1 having been constituted in the manner described above, and in which an ink storing and discharging member 60 is secured to the bottom surface of the vibrating plate 50. The ink storing and discharging member 60 is provided with a plurality of ink chambers 61, 61, . . . , in which ink compositions are to be stored, and ink discharge openings 62, 62, . . . . The plurality of the ink chambers 61, 61, . . . are formed in accordance with the number and the pattern of the protruding regions 31, 31, . . . of the piezoelectric film 30.

The ink jet type recording head 2 is constituted such that each of the protruding regions 31, 31, . . . of the piezoelectric device 1 is expanded or contracted through alteration of the electric field applied across each of the protruding regions 31, 31, . . . , and such that the discharge of the ink composition from the corresponding ink chamber 61 and the quantity of the ink composition discharged from the corresponding ink chamber 61 are thereby controlled.

This embodiment of the piezoelectric device 1 and the ink jet type recording head 2 are constituted in the manner described above.

[Production Process]

A process for producing the piezoelectric device 1 and the ink jet type recording head 2 will be described hereinbelow with reference to FIGS. 2A to 2F. FIGS. 2A to 2F are sectional views showing a process for producing the embodiment of the piezoelectric device of FIG. 1.

(Step (A))

Figure 2A:
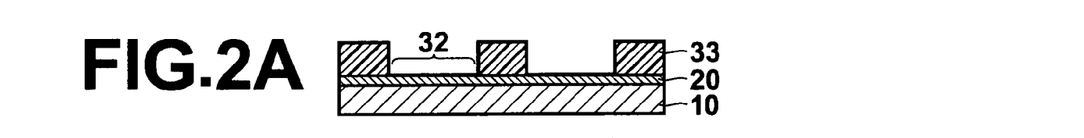
FIGS. 2A to 2F are sectional views showing a process for producing the embodiment of the piezoelectric device of FIG. 1.
Figure 2B:
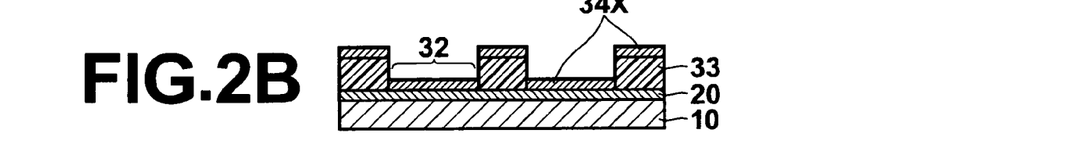
Figure 2C:
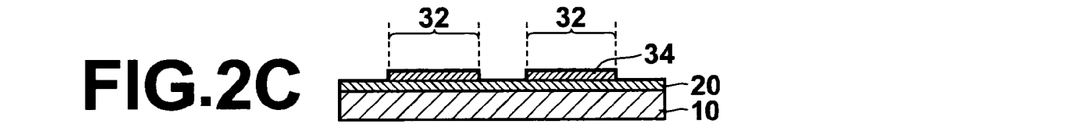

Firstly, as illustrated in FIGS. 2A, 2B, and 2C, the bottom electrode 20 is formed over approximately the entire area of the surface of the base plate 10, and a sacrifice layer 34, which is capable of being removed selectively in a step (a lift-off step) (C) as will be described later, is formed in a predetermined pattern in the protrusion non-forming regions 32, 32, . . . on the base plate 10.

The sacrifice layer 34 may be of one of a wide variety of kinds, such that the sacrifice layer 34 is capable of being removed selectively in the step (C) as will be described later. By way of example, the sacrifice layer 34 should preferably be a layer, which is capable of being oxidized by heat processing and is capable of being thus separated from the bottom electrode 20. The sacrifice layer 34 should preferably be constituted of a material, which contains a carbon-containing compound and/or a carbon simple substance as a principal constituent. The sacrifice layer 34 should more preferably be constituted of a material, which contains, as a principal constituent, a carbon simple substance, such as amorphous carbon, graphite, crystallite or polycrystalline carbon in which an amorphous moiety and a graphite moiety are present together, or diamond-like carbon. The above-enumerated carbon simple substances are easy to conduct heat processing. Alternatively, the material for the sacrifice layer 34 may be a composite material, which contains an arbitrary different constituent when necessary. In such cases, the composite material should preferably contain the carbon-containing compound and/or the carbon simple substance in a proportion of at least 10% by mass.

The sacrifice layer 34 having the predetermined pattern is capable of being formed with a lift-off technique as described below. Specifically, as illustrated in FIG. 2A, a resist layer 33 is formed on the bottom electrode 20, which has been formed on the base plate 10, in the pattern identical with the pattern of the protruding regions 31, 31, . . . of the piezoelectric film 30. Thereafter, as illustrated in FIG. 2B, a solid sacrifice layer 34X is formed over approximately the entire area of the surfaces of the regions of the bottom electrode 20 having been formed on the base plate 10, which regions have not been provided with the resist layer 33, and the surface of the resist layer 33. Thereafter, as illustrated in FIG. 2C, the resist layer 33 is removed with dissolving processing, or the like, and the unnecessary regions of the solid sacrifice layer 34X, which unnecessary regions are located on the resist layer 33, are thereby removed.

Alternatively, the sacrifice layer 34 having the predetermined pattern is capable of being formed with a photolithography technique as described below. Specifically, a solid sacrifice layer is formed over approximately the entire area of the bottom electrode 20 having been formed on the base plate 10. Thereafter, a resist layer is formed in the predetermined pattern on the solid sacrifice layer. Thereafter, the resist layer is utilized as a mask, and the unnecessary regions of the solid sacrifice layer are removed with etching processing. The resist layer having been utilized as the mask is then removed.

(Step (B))

Figure 2D:
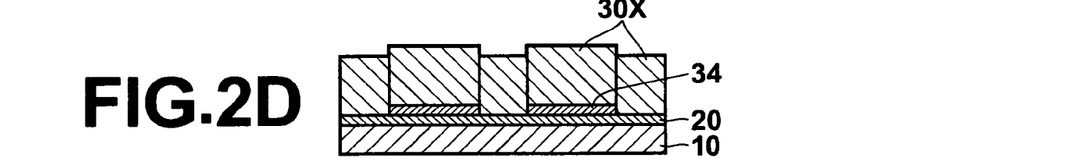

Thereafter, as illustrated in FIG. 2D, on the side of the base plate 10, on which side the sacrifice layer 34 has been formed in the predetermined pattern, a solid piezoelectric film (acting as the pillar-shaped structure film) 30X is formed. The solid piezoelectric film 30X contains a plurality of pillar-shaped bodies, each of which extends in a direction nonparallel with the base plate surface of the base plate 10. In cases where each of the pillar-shaped bodies is grown in the direction approximately normal to the base plate surface of the base plate 10, the solid piezoelectric film 30X having the crystal orientational characteristics approximately in the (100) direction is obtained.

As described above, the film thickness of the piezoelectric film 30 may ordinarily be at least 1 μm and may fall within the range of, for example, 1 μm to 5 μm. Also, the mean pillar diameter of the plurality of the pillar-shaped bodies contained in the piezoelectric film 30 may fall within the range of, for example, 30 nm to 1 μm. In the step (C), which will be described later, the unnecessary regions of the solid piezoelectric film 30X are removed, and the piezoelectric film 30 is thereby obtained. Therefore, the film thickness of the solid piezoelectric film 30X is equal to the film thickness of the piezoelectric film 30. The film of the piezoelectric material may be formed with one of a wide variety of film forming techniques. For example, it is possible to employ a vapor phase growing technique, such as a chemical vapor deposition (CVD) technique or a sputtering technique. In cases where the conditions, such as the film formation temperature and the pressure, are adjusted in accordance with the kind of the material, the pillar-shaped bodies having the desired mean pillar diameter are capable of being caused to grow in a desired direction.

The film formation of the solid piezoelectric film 30X should preferably be performed under heating conditions. The film formation temperature is set at a temperature, at which the inorganic film (the pillar-shaped structure film) containing the plurality of the pillar-shaped bodies is capable of being formed reliably, and at which the sacrifice layer 34 does not peel off from the bottom electrode 20. In cases where PZT is employed as the material of the solid piezoelectric film 30X, the film formation temperature should preferably fall within the range of 400° C. to less than 600° C.

(Step (C))

Figure 2E:
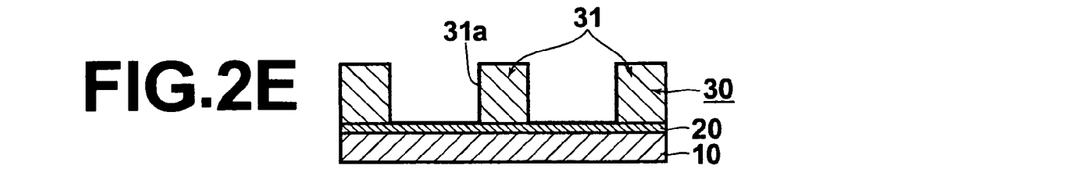

Thereafter, as illustrated in FIG. 2E, the sacrifice layer 34 and the unnecessary regions of the solid piezoelectric film 30X, which unnecessary regions are located on the sacrifice layer 34, are removed by use of the lift-off technique. In this manner, the piezoelectric film 30, which is constituted of the plurality of the protruding regions 31, 31, . . . having been formed in the pattern described above, is formed on the bottom electrode 20 having been formed on the base plate 10. In cases where the sacrifice layer 34 contains the carbon simple substance as the principal constituent, the sacrifice layer 34 is capable of being oxidized and peeled off with heat processing at a temperature of at least 600° C., and the lift-off processing is thus capable of being performed.

As described above, the solid piezoelectric film 30X contains the plurality of the pillar-shaped bodies, each of which extends in the direction nonparallel with the base plate surface of the base plate 10. The pillar-shaped bodies, which are adjacent to each other, are apt to be mechanically separated easily from each other. Therefore, in the lift-off step (C), the unnecessary regions and the necessary regions of the solid piezoelectric film 30X are capable of being separated appropriately from each other at the interface of each of the pillar-shaped bodies, and only the unnecessary regions of the solid piezoelectric film 30X are capable of being removed easily and at a high accuracy. Accordingly, pattern defects, such as pattern loss, are capable of being suppressed markedly.

Also, since the unnecessary regions and the necessary regions of the solid piezoelectric film 30X are separated from each other at the interface of each of the pillar-shaped bodies, the plurality of the pillar-shaped bodies, which are exposed at the side face 31a of each of the protruding regions 31, 31, . . . of the piezoelectric film 30, are terminated at the interface of each of the pillar-shaped bodies. In cases where patterning processing is performed on the solid piezoelectric film containing the pillar-shaped bodies, by use of a dry etching technique, clear termination at the interface of each of the pillar-shaped bodies is not capable of occurring, and a random surface of the termination arises. (Reference may be made to Comparative Example 2.)

With this embodiment, the unnecessary regions and the necessary regions of the solid piezoelectric film 30X are capable of being separated from each other at the interface of each of the pillar-shaped bodies. Therefore, the face direction of the side face 31a of each of the protruding regions 31, 31, . . . coincides with the direction of growth of the pillar-shaped bodies. Specifically, a variation of the angle θ of the side face 31a of each of the protruding regions 31, 31, . . . with respect to the base plate surface of the base plate 10, which variation occurs among the protruding regions 31, 31, . . . , is capable of being suppressed markedly. Also, the smoothness of the side face 31a of each of the protruding regions 31, 31, . . . is capable of being kept good.

With this embodiment, the angle of the direction of the growth of each of the pillar-shaped bodies with respect to the base plate surface of the base plate 10 should preferably fall within the range of 90±45° (should more preferably fall within the range of 90±30°, and should particularly preferably fall within the range of 90±10°) In such cases, the angle θ of the side face 31a of each of the protruding regions 31, 31, . . . of the piezoelectric film 30 with respect to the base plate surface of the base plate 10 is capable of being reliably set to fall within the preferable range of 90±45° (the more preferable range of 90±30°, and the particularly preferable the range of 90±10°). Specifically, in cases where the pillar-shaped bodies are caused to grow in the direction approximately normal to the base plate surface, the shape of the side face 31a of each of the protruding regions 31, 31, . . . of the piezoelectric film 30 is capable of being reliably set at the shape approximately normal to the base plate surface.

As described above, with this embodiment, the piezoelectric film 30 constituted of the protruding regions 31, 31, . . . is capable of being formed reliably, such that the pattern defects, such as pattern loss, are capable of being suppressed markedly, such that the variation of the angle θ of the side face 31a of each of the protruding regions 31, 31, . . . with respect to the base plate surface of the base plate 10, which variation occurs among the protruding regions 31, 31, . . . , is capable of being suppressed markedly, such that the smoothness of the side face 31a of each of the protruding regions 31, 31, . . . is capable of being kept good, and such that the shape accuracy of each of the protruding regions 31, 31, . . . is capable of being kept high. The aforesaid effects of this embodiment are capable of being obtained regardless of the material and the thickness of the piezoelectric film 30.

(Step (D))

Figure 2F:
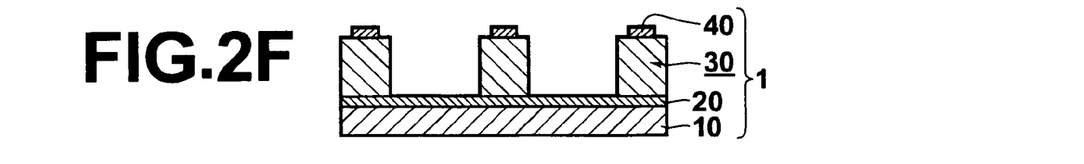

Finally, as illustrated in FIG. 2F, each of the top electrodes 40, 40, . . . is formed on one of the protruding regions 31, 31, . . . . Also, when necessary, the bottom surface of the base plate 10 is subjected to etching processing, and the thickness of the base plate 10 is thus set to be thin. At this stage, the production of the piezoelectric device 1 is completed.

Thereafter, the vibrating plate 50 and the ink storing and discharging member 60 are fitted to the piezoelectric device 1. (The steps of fitting the vibrating plate 50 and the ink storing and discharging member 60 to the piezoelectric device 1 are not shown.) In this manner, the ink jet type recording head 2 is produced.

This embodiment of the piezoelectric device 1 is produced with the process comprising: (i) the step (A) of forming the selectively removable sacrifice layer 34 in the predetermined pattern in the protrusion non-forming regions 32, 32, . . . of the piezoelectric film 30 on the base plate 10, (ii) the step (B) of forming the solid piezoelectric film (acting as the pillar-shaped structure film) 30X on the side of the base plate 10, on which side the sacrifice layer 34 has been formed in the predetermined pattern, the solid piezoelectric film 30X containing the plurality of the pillar-shaped bodies, each of which extends in the direction nonparallel with the base plate surface of the base plate 10, and (iii) the step (C) of removing the sacrifice layer 34, and the regions of the solid piezoelectric film 30X, which regions are located on the sacrifice layer 34, by use of the lift-off technique, whereby the protruding regions 31, 31, . . . , each of which contains the plurality of the pillar-shaped bodies, is formed.

The pillar-shaped bodies, which are adjacent to each other, are apt to be mechanically separated easily from each other. Therefore, as described above, with this embodiment, in the step (C) (i.e., the lift-off step), regardless of the material and the thickness of the piezoelectric film 30, the unnecessary regions and the necessary regions of the solid piezoelectric film 30X are capable of being separated appropriately from each other at the interface of each of the pillar-shaped bodies, and only the unnecessary regions of the solid piezoelectric film 30X are capable of being removed easily and at a high accuracy. Also, the piezoelectric film 30 constituted of the protruding regions 31, 31, . . . is capable of being formed reliably, such that the pattern defects, such as pattern loss, are capable of being suppressed markedly, such that the variation of the angle θ of the side face 31a of each of the protruding regions 31, 31, . . . with respect to the base plate surface of the base plate 10, which variation occurs among the protruding regions 31, 31, . . . , is capable of being suppressed markedly, such that the smoothness of the side face 31a of each of the protruding regions 31, 31, . . . is capable of being kept good, and such that the shape accuracy of each of the protruding regions 31, 31, . . . is capable of being kept high.

Further, with this embodiment, in cases where the pillar-shaped bodies are caused to grow in the direction approximately normal to the base plate surface, the shape of the side face 31a of each of the protruding regions 31, 31, . . . of the piezoelectric film 30 is capable of being reliably set at the shape approximately normal to the base plate surface.

Furthermore, with this embodiment, the patterning processing for the piezoelectric film 30 is capable of being performed more quickly than with the dry etching. Also, with this embodiment, wherein a high vacuum process, such as the dry etching, need not be performed at the time of the patterning processing, the cost is capable of being kept low.

In the embodiment described above, in the step (A), the sacrifice layer 34 constituted of the material, which contains the carbon-containing compound and/or the carbon simple substance as a principal constituent, is formed in the predetermined pattern by use of the lift-off technique. Alternatively, the sacrifice layer 34 may be formed in the predetermined pattern by use of a photolithography technique (as will be described later in Example 1) or a transfer molding technique. With the photolithography technique or the transfer molding technique, the sacrifice layer 34 constituted of an organic material is formed in the predetermined pattern. With the transfer molding technique, the patterning processing is capable of being performed easily, and the patterning processing with a high definition on the nano order is also capable of being performed.

With the transfer molding technique, a mold having been subjected to the patterning processing is pressed, and the predetermined pattern is transferred to a resist layer. The resist layer is hardened in this state, and the mold is then separated from the resist layer. In this manner, the predetermined pattern is formed. The transfer molding technique maybe classified into a thermal cycle type and a photo-setting type.

The thermal cycle type of the transfer molding technique is utilized for the patterning processing performed on a thermoplastic resin. With the thermal cycle type of the transfer molding technique, the thermoplastic resin is heated to a temperature at least equal to its glass transition temperature (Tg) and is softened. Also, a mold having a predetermined pattern is pressed against the thermoplastic resin having been softened, and the predetermined pattern is thus transferred to the thermoplastic resin. Examples of the thermoplastic resins include a (meth)acrylic resin (a PMMA resin), which contains, as a principal constituent, a homopolymer or a copolymer of (meth)acrylic acid and/or an ester of (meth)acrylic acid; and an imide resin.

The photo-setting type of the transfer molding technique is utilized for the patterning processing performed on a photo-setting resin, such as a photoresist. With the photo-setting type of the transfer molding technique, a mold is pressed against a coating layer of a photo-setting resin. Ultraviolet rays, or the like, are then irradiated to the photo-setting resin, and the photo-setting resin is thus hardened. In this manner, the predetermined pattern is transferred to the photo-setting resin.

The mold is made from quartz, Si, or an hard alloy, which contains Ti, Ni, Mo, W, or the like. The mold is capable of being patterned with a high definition by use of electron beam drawing processing, dry etching processing, or the like. Therefore, in cases where a mold having a predetermined pattern corresponding to the pattern of the protrusion non-forming regions 32, 32, . . . is utilized, the sacrifice layer 34 constituted of the organic material is capable of being easily formed in the predetermined pattern with a high definition on the protrusion non-forming regions 32, 32, . . . . In cases where a residue of the material of the sacrifice layer 34 remains in the regions, in which the protruding regions 31, 31, . . . are formed, after the mold has been removed, the residue of the material of the sacrifice layer 34 may be removed with oxygen reactive ion etching, combustion, entire area ashing with oxygen plasma irradiation, etching with a solution, or the like.

[Ink Jet Type Recording Apparatus]

Figure 3:
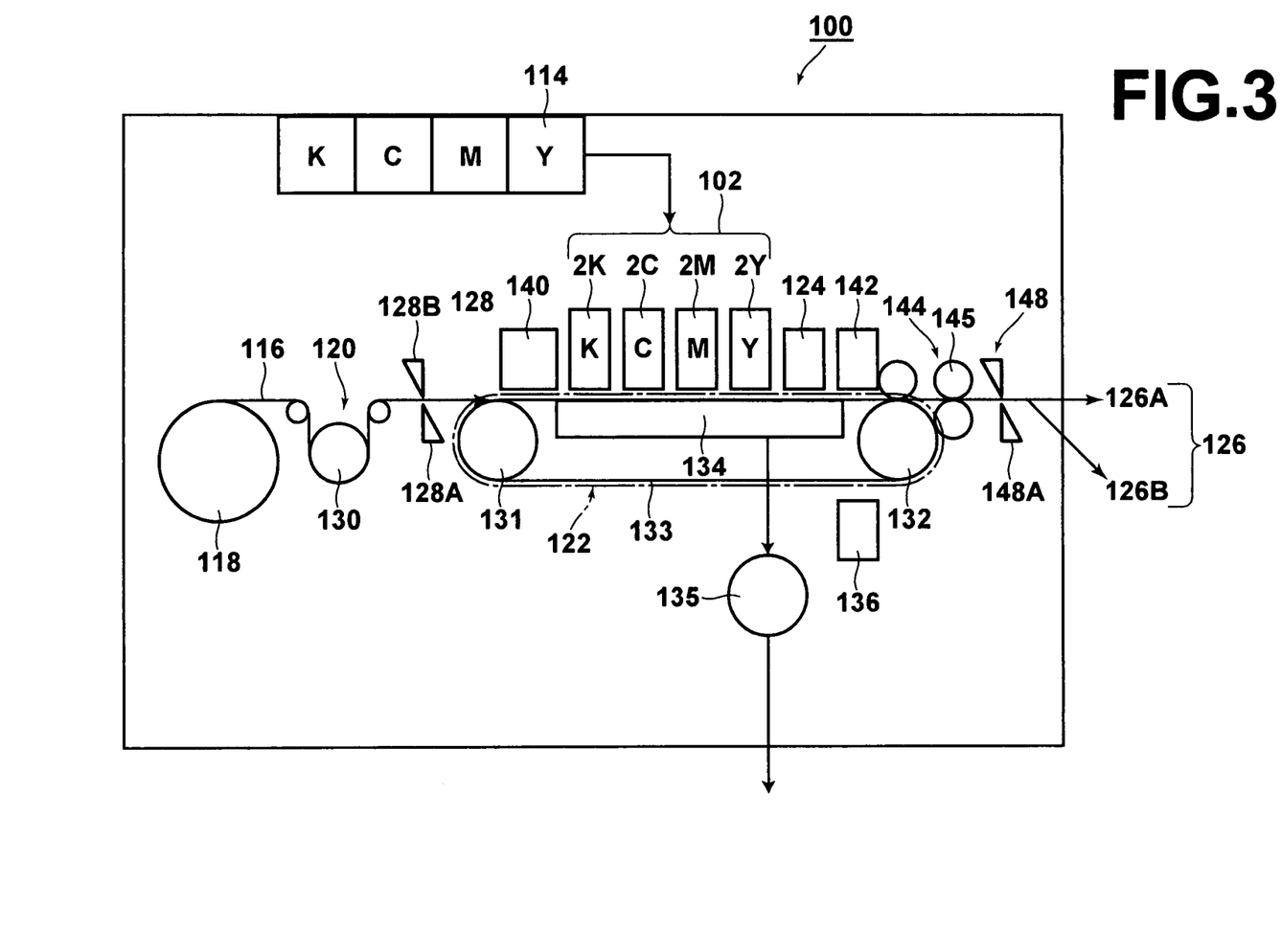
FIG. 3 is a schematic view showing an example of an ink jet type recording apparatus, in which the ink jet type recording head of FIG. 1 is employed.
Figure 4:
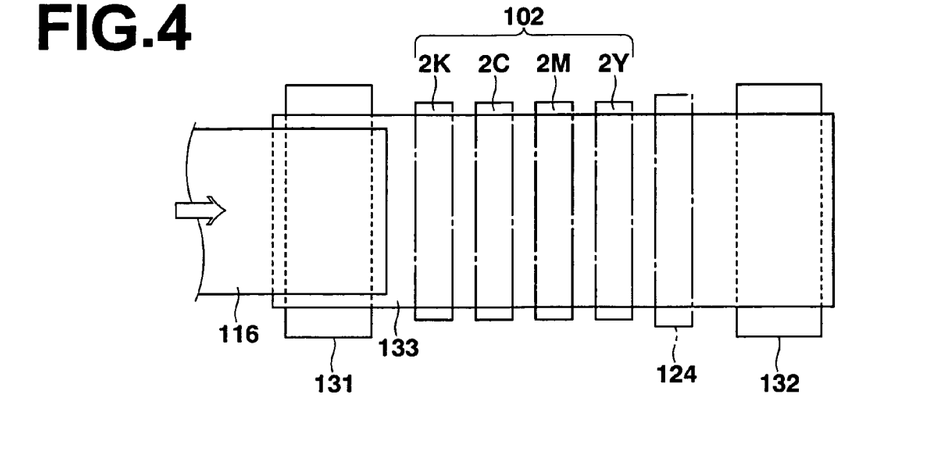
FIG. 4 is a plan view showing a part of the ink jet type recording apparatus of FIG. 3.

An example of an ink jet type recording apparatus, in which the ink jet type recording head 2 of FIG. 1 is employed, will be described hereinbelow with reference to FIG. 3 and FIG. 4. FIG. 3 is a schematic view showing an example of an ink jet type recording apparatus, in which the ink jet type recording head of FIG. 1 is employed. FIG. 4 is a plan view showing a part of the ink jet type recording apparatus of FIG. 3.

With reference to FIG. 3 and FIG. 4, an ink jet type recording apparatus 100 comprises a printing section 102, which is provided with a plurality of ink jet type recording heads (hereinbelow referred to simply as the heads) 2K, 2C, 2M, and 2Y. Each of the heads 2K, 2C, 2M, and 2Y is utilized for one of different ink colors. The ink jet type recording apparatus 100 also comprises an ink stocking and loading section 114 for storing ink compositions, each of which is to be furnished to one of the heads 2K, 2C, 2M, and 2Y. The ink jet type recording apparatus 100 further comprises a paper supply section 118 for supplying recording paper 116. The ink jet type recording apparatus 100 still further comprises a de-curling processing section 120 for eliminating roll set curl of the recording paper 116 having been received from the paper supply section 118. The ink jet type recording apparatus 100 also comprises a suction belt conveyor section 122, which is located so as to stand facing a nozzle bottom surface (i.e., an ink discharge surface) of the printing section 102. The suction belt conveyor section 122 conveys the recording paper 116, while flatness of the recording paper 116 is being kept. The ink jet type recording apparatus 100 further comprises a print detecting section 124 for reading out the results of the printing performed with the printing section 102. The ink jet type recording apparatus 100 still further comprises a paper discharge section 126 for discharging the printed recording paper (i.e., the printed paper) to the exterior of the ink jet type recording apparatus 100.

Each of the heads 2K, 2C, 2M, and 2Y of the printing section 102 is constituted of the ink jet type recording head 2 illustrated in FIG. 1.

In the de-curling processing section 120, heat is given by a heating drum 130 to the recording paper 116 in the direction reverse to the direction of the roll set curl, and the de-curling processing is thereby performed.

As illustrated in FIG. 3, in the cases of the ink jet type recording apparatus 100 utilizing the rolled paper, a cutter 128 is located at the stage after the de-curling processing section 120, and the rolled paper is cut by the cutter 128 into a desired size. The cutter 128 is constituted of a stationary blade 128A, which has a length equal to at least the width of the conveyance path for the recording paper 116, and a round blade 128B, which is capable of being moved along the stationary blade 128A. The stationary blade 128A is located on the side of the rear surface of the recording paper 116, which rear surface is opposite to the printing surface of the recording paper 116. Also, the round blade 128B is located on the side of the printing surface of the recording paper 116 with the conveyance path intervening between the stationary blade 128A and the round blade 128B. In the cases of an apparatus utilizing cut paper sheets, the apparatus need not be provided with the cutter 128.

The recording paper 116, which has been subjected to the de-curling processing and has then been cut into the desired size, is sent into the suction belt conveyor section 122. The suction belt conveyor section 122 has the structure, in which an endless belt 133 is threaded over two rollers 131 and 132. The suction belt conveyor section 122 is constituted such that at least a part of the suction belt conveyor section 122, which part stands facing the nozzle bottom surface of the printing section 102 and a sensor surface of the print detecting section 124, may constitute a horizontal surface (a flat surface).

The belt 133 has a width larger than the width of the recording paper 116. The belt 133 has a plurality of suction holes (not shown), which are open at the belt surface. Also, a suction chamber 134 is located within the space defined by the belt 133, which is threaded over the two rollers 131 and 132. Specifically, the suction chamber 134 is located at the position that stands facing the nozzle bottom surface of the printing section 102 and the sensor surface of the print detecting section 124. The region within the suction chamber 134 is evacuated into a negative pressure by use of a fan 135, and the recording paper 116 located on the belt 133 is thereby supported by suction on the belt 133.

Rotation power of a motor (not shown) is transferred to at least either one of the rollers 131 and 132, over which the belt 133 is threaded. The belt 133 is thus rotated clockwise in FIG. 3, and the recording paper 116 having been supported on the belt 133 is thereby conveyed toward the right in FIG. 3.

In the cases of brimless printing, or the like, it will occur that the ink composition clings to the belt 133 beyond the area of the recording paper 116. Therefore, a belt cleaning section 136 is located at a predetermined position on the side outward from the space defined by the belt 133 (specifically, at an appropriate position other than the printing region).

A heating fan 140 is located on the side upstream from the printing section 102 with respect to the paper conveyance path, which is formed by the suction belt conveyor section 122. The heating fan 140 blows dry air against the recording paper 116 before being subjected to the printing and thereby heats the recording paper 116. In cases where the recording paper 116 is thus heated just before the recording paper is subjected to the printing, the ink composition having been jetted out onto the recording paper 116 is capable of drying easily.

As illustrated in FIG. 4, the printing section 102 is constituted of the full-line type heads. Specifically, in the printing section 102, the line type heads having a length corresponding to a maximum paper width are located so as to extend in the direction (i.e., the main scanning direction), which is normal to the paper feed direction. Each of the heads 2K, 2C, 2M, and 2Y is constituted of the line type head provided with a plurality of ink discharge openings (of the nozzles), which are arrayed over a length at least longer than one side of the recording paper 116 of the maximum size to be processed by the ink jet type recording apparatus 100.

The heads 2K, 2C, 2M, and 2Y corresponding to the ink colors are located in the order of black (K), cyan (C), magenta (M), and yellow (Y) from the upstream side with respect to the feed direction of the recording paper 116. The color ink compositions are discharged respectively from the heads 2K, 2C, 2M, and 2Y, while the recording paper 116 is being conveyed. A color image is thus recorded on the recording paper 116.

The print detecting section 124 may be constituted of, for example, a line sensor for imaging the results of the droplet jetting-out operation performed by the printing section 102. The print detecting section 124 thus detects discharge failures, such as nozzle clogging, in accordance with the droplet jetting-out image having been read out by the line sensor.

A post-drying section 142 is located at the stage after the print detecting section 124. The post-drying section 142 may be constituted of, for example, a heating fan for drying the printed image surface. At the stage before the ink composition having been jetted out onto the recording paper 116 dries, the printing surface should preferably be free from contact with a drying member, or the like. Therefore, the post-drying section 142 should preferably employ a drying technique for blowing hot air against the printing surface.

In order to control surface gloss of the image surface, a heating and pressure applying section 144 is located at the stage after the post-drying section 142. In the heating and pressure applying section 144, a pressure is applied to the image surface by a press roller 145 having a predetermined surface recess-protrusion pattern, while the image surface is being heated. The recess-protrusion pattern is thus transferred from the press roller 145 to the image surface.

The printed paper having thus been obtained is then discharged through the paper discharge section 126. Ordinarily, the printed paper, on which a regular image (an object image) to be recorded has been printed, and the printed paper, on which a test printing image has been printed, should preferably be discharged to different destinations. The ink jet type recording apparatus 100 is provided with sorting means (not shown) for sorting out the printed paper, on which the regular image to be recorded has been printed, and the printed paper, on which the test printing image has been printed, and changing over the paper discharge paths to each other in order to send the printed paper, on which the regular image to be recorded has been printed, and the printed paper, on which the test printing image has been printed, into a discharge section 126A and a discharge section 126B, respectively.

In cases where both the regular image to be recorded and the test printing image are printed in parallel on a single large-sized paper sheet at the printing section 102, a cutter 148 may be located in order to separate the paper sheet region, on which the test printing image has been printed, from the paper sheet region, on which the regular image to be recorded has been printed.

The ink jet type recording apparatus 100 is constituted in the manner described above.

(Design Modifications)

The recess-protrusion structure body, the process for producing a recess-protrusion structure body, the piezoelectric device, the ink jet type recording head, and the ink jet type recording apparatus in accordance with the present invention are not limited to the embodiments described above and maybe embodied in various other ways.

For example, in the embodiments described above, the base plate 10 and the vibrating plate 50 are constituted as different members. Alternatively, in lieu of the vibrating plate 50 being utilized, the base plate 10 may be constituted so as to have the function of the vibrating plate.

Also, in the embodiments described above, the recess-protrusion structure body in accordance with the present invention is constituted as the piezoelectric device. However, the process for producing a recess-protrusion structure body in accordance with the present invention is applicable to the patterning processing performed on an arbitrary material, which enables the pillar-shaped bodies to grow. The process for producing a recess-protrusion structure body in accordance with the present invention is particularly appropriately applicable to the patterning processing performed on an inorganic film, such as the piezoelectric film, which is constituted of a material hard to etch and is formed to be thicker than the electrodes, and the like, having a thickness on the order of nanometers.

Examples of the materials for the inorganic films, which materials enable the pillar-shaped bodies to grow and are other than the piezoelectric material, include dielectric substances, e.g., oxides, such as $ZrO_2$, ZnO, $Al_2O_3$, and $TiO_2$; nitrides, such as AlN, $Si_3N_4$, and TiN; and carbides, such as SiC, and $B_4C$. Examples of the materials for the inorganic films, which materials enable the pillar-shaped bodies to grow and are other than the piezoelectric material, also include metals, such as Al, Cu, Ta, and Ti; and combinations of the above-enumerated materials. Also, an organic material maybe employed as the material of the pillar-shaped structure film for use in use applications in which no problem occurs with the organic material. In cases where the organic material is employed as the material of the pillar-shaped structure film, examples of vapor deposition techniques include a plasma enhanced chemical vapor deposition technique and a molecular beam vapor deposition technique.

EXAMPLES

The present invention will further be illustrated by the following nonlimitative examples.

Example 1

A resist pattern having a thickness of 2 μm was formed with a line width (L) of 10 μm and a line space (S) of 10 μm on a glass base plate by use of a resist material (AZ5214, supplied by Clariant Co.). Thereafter, a solid $ZrO_2$ film having a thickness of 5 μm was formed with a vacuum evaporation technique over approximately the entire area of the surface of the base plate, on which the resist pattern had been formed. The conditions, under which the solid $ZrO_2$ film was formed, were set such that the temperature was equal to the room temperature, and such that the pressure was equal to $5 \times 10^{-2}$ Pa. The conditions, under which the solid $ZrO_2$ film was formed, were thus set such that pillar-shaped bodies having a mean pillar diameter of approximately 50 nm might grow in a direction approximately normal to the base plate surface. The base plate, on which the solid $ZrO_2$ film had been formed, was then dipped in acetone, and the resist was thus dissolved. In this manner, the patterning processing was performed on the solid $ZrO_2$ film by use of the lift-off technique, and a recess-protrusion structure body in accordance with the present invention was obtained.

With SEM sectional observation, it was confirmed that the $ZrO_2$ film obtained from the patterning processing was an inorganic film containing a plurality of pillar-shaped bodies (mean pillar diameter: 50 nm), which had been grown in the direction approximately normal to the base plate surface. Also, it was found that the pattern with the line width (L) of 10 μm and the line space (S) of 10 μm had been formed appropriately. Each of the pillar-shaped bodies, which were exposed at the side face of each of the protruding regions of the $ZrO_2$ film, was terminated at the interface of the pillar-shaped body, and the smoothness of the side face of each of the protruding regions of the $ZrO_2$ film was good. Further, the angle θ of the side face of each of the protruding regions of the $ZrO_2$ film with respect to the base plate surface was equal to approximately 90°.

Comparative Example 1

A recess-protrusion structure body for comparison was produced with the patterning processing utilizing the lift-off technique in the same manner as that in Example 1, except that the conditions, under which the solid $ZrO_2$ film was formed, were set such that the temperature was equal to 500° C., and such that the pressure was equal to $1 \times 10^{-4}$ Pa. The conditions, under which the solid $ZrO_2$ film was formed, were thus set such that pillar-shaped bodies might not grow, and such that an isotropic film might grow.

With SEM observation, it was found that loss occurred at corner areas of the protruding regions constituting the pattern of the $ZrO_2$ film, and that the pattern shape accuracy was bad.

Example 2

A resist pattern having a thickness of 2 μm was formed with a line width (L) of 10 μm and a line space (S) of 10 μm on an Si base plate having a surface, on which a Pt film having a thickness of 200 nm had been formed previously. The resist pattern was formed by use of the resist material (AZ5214, supplied by Clariant Co.). Thereafter, a diamond-like carbon film having a thickness of approximately 0.5 μm was formed over approximately the entire area of the surface of the base plate, on which the resist pattern had been formed. Thereafter, the resist pattern was dissolved. In this manner, the sacrifice layer constituted of the diamond-like carbon was formed in the predetermined pattern by use of the lift-off technique.

Thereafter, a solid PZT film having a thickness of 5 μm was formed with a sputtering technique over approximately the entire area of the surface of the base plate, on which the sacrifice layer had been formed in the predetermined pattern. The conditions, under which the solid PZT film was formed, were set such that the temperature of the base plate was equal to 550° C. The conditions, under which the solid PZT film was formed, were thus set such that pillar-shaped bodies having a mean pillar diameter of approximately 150 nm and having crystal orientational characteristics approximately in the (100) direction might grow in a direction approximately normal to the base plate surface.

Thereafter, the base plate, on which the solid PZT film had been formed, was subjected to heat processing at a temperature of 650° C. in an oxygen atmosphere, and the sacrifice layer was thus oxidized and peeled off. In this manner, the patterning processing was performed on the solid PZT film by use of the lift-off technique, and a recess-protrusion structure body in accordance with the present invention was produced.

With SEM observation, it was confirmed that the PZT film obtained from the patterning processing was an inorganic film containing a plurality of pillar-shaped bodies (mean pillar diameter: 150 nm), which had been grown in the direction approximately normal to the base plate surface. Also, it was found that the pattern with the line width (L) of 10 μm and the line space (S) of 10 μm had been formed appropriately. Each of the pillar-shaped bodies, which were exposed at the side face of each of the protruding regions of the PZT film, was terminated at the interface of the pillar-shaped body, and the smoothness of the side face of each of the protruding regions of the PZT film was good. Further, the angle θ of the side face of each of the protruding regions of the PZT film with respect to the base plate surface was equal to approximately 90°. FIG. 5A shows an SEM perspective photograph of the recess-protrusion structure body obtained in Example 2. FIG. 5B shows an SEM sectional photograph of the recess-protrusion structure body obtained in Example 2.

Comparative Example 2

A solid PZT film was formed over approximately the entire area of an Si base plate having a surface, on which a Pt film having a thickness of 200 nm had been formed previously. At this time, the solid PZT film was formed by use of a sputtering technique with the temperature of the base plate being set at 550° C. Thereafter, a resist pattern was formed with a line width (L) of 10 μm and a line space (S) of 10 μm on the solid PZT film. The resist pattern was utilized as a mask, and reactive ion etching (RIE) was performed. The patterning processing was thus performed on the solid PZT film. Also, the resist pattern acting as the mask was removed. In this manner, a recess-protrusion structure body for comparison was produced.

With SEM observation, it was found that a side face of each of the protruding regions constituting the pattern of the PZT film had a taper of approximately 70° and was terminated at a position different from the interface of each of the pillar-shaped bodies.

INDUSTRIAL APPLICABILITY

The present invention is applicable to patterning processing for recess-protrusion structure bodies and is appropriately applicable to piezoelectric devices, and the like.

What is claimed is:

1. A recess-protrusion structure body, comprising:
   i) a base plate, and
   ii) at least one protruding region on the base plate,
wherein:
   the at least one protruding region comprises a pillar-shaped structure film containing a plurality of pillar-shaped bodies,
   each of the plurality of pillar-shaped bodies has a smaller diameter than the width of the at least one protruding region and extends in a direction nonparallel with a base plate surface of the base plate, and
   each of the plurality of pillar-shaped bodies is exposed at a side face of the protruding region, and ends at an interface of the pillar-shaped body.

2. A recess-protrusion structure body, comprising a base plate and at least one protruding region formed on the base plate, produced by a process comprising:
   i) a step (A) of forming a selectively removable resist layer or a selectively removable sacrifice layer in a predetermined pattern in a protrusion non-forming region on the base plate,
   ii) a step (B) of forming a pillar-shaped structure film on a side of the base plate, on which side the resist layer or the sacrifice layer has been formed in the predetermined pattern, the pillar-shaped structure film containing a plurality of pillar-shaped bodies, each of which has a smaller diameter than the at least one protruding region, and extends in a direction nonparallel with a base plate surface of the base plate, and
   iii) a step (C) of removing the resist layer or the sacrifice layer, and a region of the pillar-shaped structure film, which region is located on the resist layer or the sacrifice layer, by use of a lift-off technique,
   whereby the at least one protruding region, which contains the plurality of the pillar-shaped bodies, is formed.

3. A recess-protrusion structure body as defined in claim 2 wherein a height of the protruding region is equal to at least 1 µm, and a mean pillar diameter of the plurality of the pillar-shaped bodies contained in the protruding region falls within the range of 30 nm to 1 µm.

4. A recess-protrusion structure body as defined in claim 2 wherein an angle of a side face of the protruding region with respect to the base plate surface of the base plate falls within the range of 90±45°.

5. A recess-protrusion structure body as defined in claim 2 wherein the protruding region is constituted of an inorganic material.

6. A recess-protrusion structure body as defined in claim 2 wherein the protruding region is constituted of a dielectric material.

7. A recess-protrusion structure body as defined in claim 2 wherein the protruding region is constituted of a piezoelectric material.

8. A piezoelectric device, which is provided with a recess-protrusion structure body as defined in claim 7, the piezoelectric device comprising:
   i) the base plate,
   ii) a piezoelectric film, which contains the at least one protruding region, and which has been formed on the base plate, and
   iii) electrodes, which have been formed on the base plate, the electrodes applying an electric field across the piezoelectric film.

9. An ink jet type recording head, comprising a piezoelectric device as defined in claim 8.

10. An ink jet type recording apparatus, comprising an ink jet type recording head as defined in claim 9.

11. A recess protrusion structure body as defined in claim 2, wherein:
    the pillar shaped structure film formed in step (B) is a Thornton zone model pillar shaped structure film.

12. A recess-protrusion structure body, comprising:
    i) a base plate, and
    ii) at least one protruding region, which has been formed on the base plate,
    the at least one protruding region having been formed with patterning processing performed on a pillar-shaped structure film containing a plurality of pillar-shaped bodies, each of which has a smaller diameter than the width of the at least one protruding region and extends in a direction nonparallel with a base plate surface of the base plate,
    each of the plurality of the pillar-shaped bodies, which are exposed at a side face of the protruding region, being terminated at an interface of the pillar-shaped body.

13. A recess-protrusion structure body as defined in claim 12 wherein a height of the protruding region is equal to at least 1 µm, and a mean pillar diameter of the plurality of the pillar-shaped bodies contained in the protruding region falls within the range of 30 nm to 1 µm.

14. A recess-protrusion structure body as defined in claim 12 wherein an angle of a side face of the protruding region with respect to the base plate surface of the base plate falls within the range of 90±45°.

15. A recess-protrusion structure body as defined in claim 12 wherein the protruding region is constituted of an inorganic material.

16. A recess-protrusion structure body as defined in claim 12 wherein the protruding region is constituted of a dielectric material.

17. A recess-protrusion structure body as defined in claim 12 wherein the protruding region is constituted of a piezoelectric material.

18. A piezoelectric device, which is provided with a recess-protrusion structure body as defined in claim 17, the piezoelectric device comprising:
    i) the base plate,
    ii) a piezoelectric film, which contains the at least one protruding region, and which has been formed on the base plate, and
    iii) electrodes, which have been formed on the base plate, the electrodes applying an electric field across the piezoelectric film.

19. An ink jet type recording head, comprising a piezoelectric device as defined in claim 18.

20. An ink jet type recording apparatus, comprising an ink jet type recording head as defined in claim 19.

21. A recess protrusion structure body as defined in claim 12, wherein:
    the pillar shaped structure film is a Thornton zone model pillar shaped structure film.

* * * * *